United States Patent [19]

Clemens et al.

[11] Patent Number: 6,082,440
[45] Date of Patent: Jul. 4, 2000

[54] HEAT DISSIPATION SYSTEM HAVING RELEASABLE ATTACHMENT ASSEMBLY

[75] Inventors: Donald L. Clemens, The Colony; Michael M. Heatly, Arlington; Matthew C. Smithers, Lewisville; Mark C. Mellinger, Flower Mound, all of Tex.

[73] Assignee: Thermalloy, Incorporated, Dallas, Tex.

[21] Appl. No.: 09/019,546

[22] Filed: Feb. 6, 1998

Related U.S. Application Data

[60] Provisional application No. 60/038,035, Feb. 6, 1997.
[51] Int. Cl.[7] ........................................... F28F 7/00
[52] U.S. Cl. ........................ 165/80.3; 165/185; 174/16.3; 257/719; 361/704; 361/710
[58] Field of Search ........................ 165/80.3, 104.33, 165/185; 257/718, 719; 361/709, 710

[56] References Cited

U.S. PATENT DOCUMENTS

| 4,203,488 | 5/1980 | Johnson et al. | 165/80.3 |
|---|---|---|---|
| 4,235,285 | 11/1980 | Johnson et al. | 165/80.3 |
| 4,710,852 | 12/1987 | Keen | 257/718 |
| 5,280,409 | 1/1994 | Selna et al. | 257/718 |
| 5,381,305 | 1/1995 | Harmon et al. | 257/718 |
| 5,396,402 | 3/1995 | Perugini et al. | 257/719 |
| 5,486,981 | 1/1996 | Blomquist | 257/719 |
| 5,521,439 | 5/1996 | Casati et al. | 257/718 |
| 5,542,468 | 8/1996 | Lin | 165/80.3 |
| 5,579,205 | 11/1996 | Tustaniwskij et al. | 257/719 |
| 5,581,442 | 12/1996 | Morosas | 257/719 |
| 5,617,292 | 4/1997 | Steiner | 257/719 |
| 5,755,276 | 5/1998 | Chiou | 257/719 |
| 5,791,403 | 8/1998 | Chiou | 257/719 |
| 5,804,875 | 9/1998 | Remsburg et al. | 257/719 |
| 5,828,553 | 10/1998 | Chiou | 165/80.3 |
| 5,835,347 | 11/1998 | Chu | 165/80.3 |
| 5,847,928 | 12/1998 | Hinshaw et al. | 257/719 |
| 5,864,464 | 1/1999 | Lin | 361/697 |
| 5,870,288 | 2/1999 | Chen | 361/704 |
| 5,973,921 | 10/1999 | Lin | 361/695 |
| 5,979,025 | 11/1999 | Horng | 165/80.3 |
| 6,012,510 | 1/2000 | Cook | 165/80.3 |

Primary Examiner—Ira S. Lazarus
Assistant Examiner—Terrell McKinnon
Attorney, Agent, or Firm—Cohen, Pontani, Lieberman & Pavane

[57] ABSTRACT

A heat dissipation system for a heat generating electronic device includes a releasable attachment assembly for removably securing a heat sink to a heat spreader plate thereof includes at least one spring clip for biasing the heat spreader plate into a secured engagement with the heat sink. The spring clips are adapted to allow easy engagement and/or disengagement of the heat sink from the heat spreader plate, thereby facilitating the use of variously configured heat sinks as part of the heat dissipation system.

31 Claims, 9 Drawing Sheets

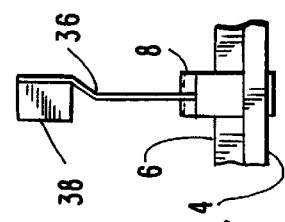
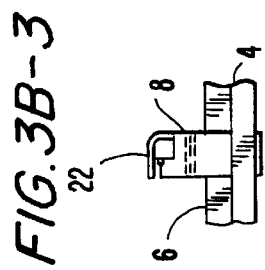
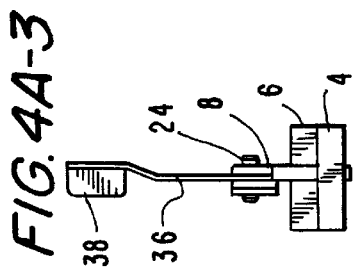
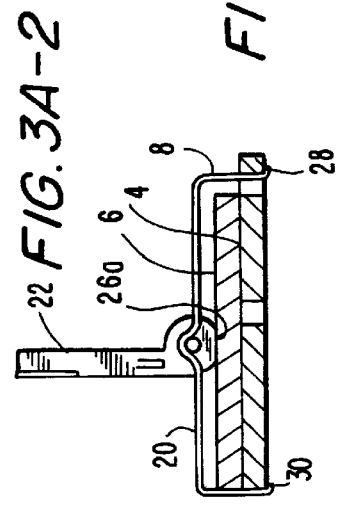
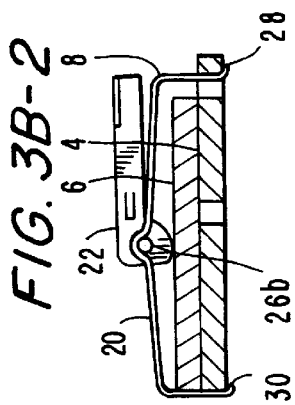
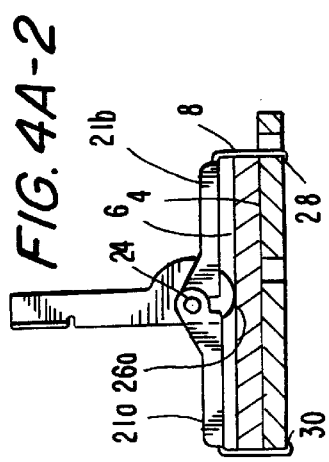
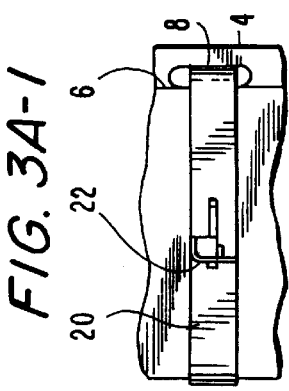
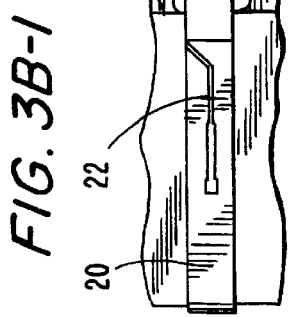
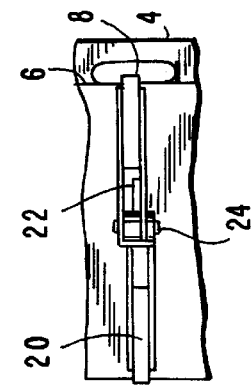

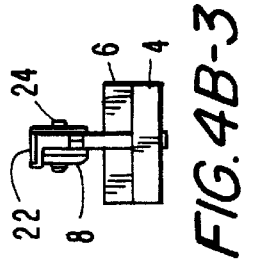
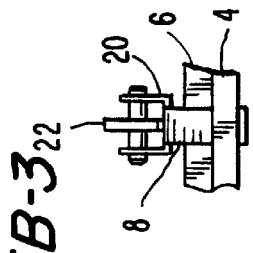
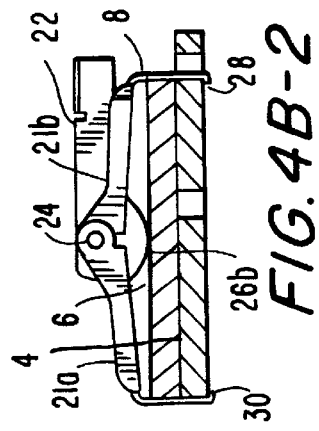
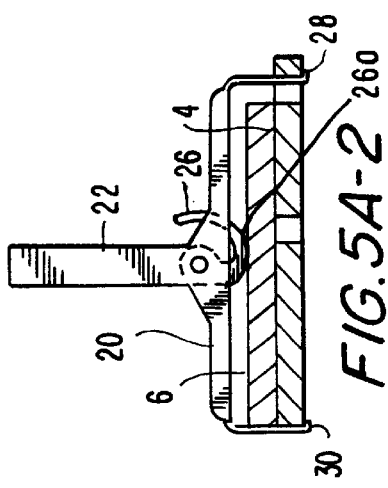
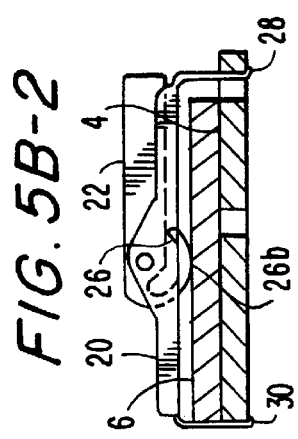
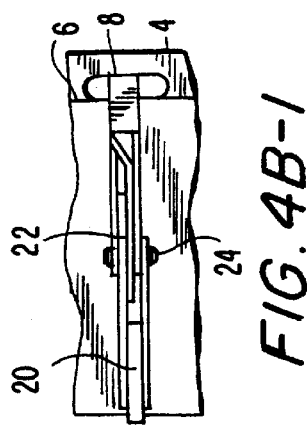
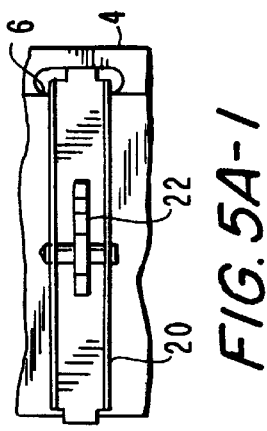
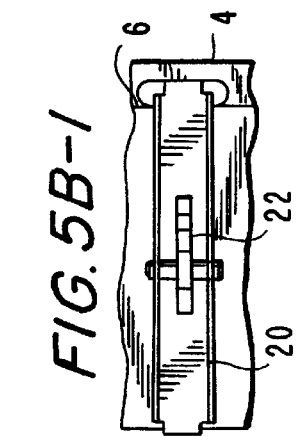

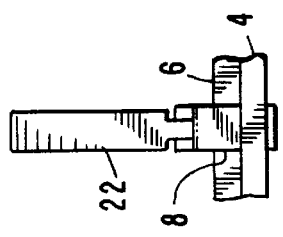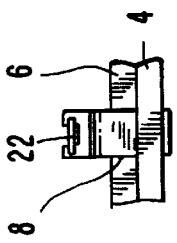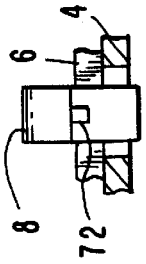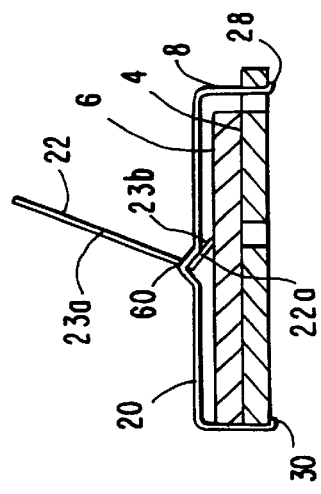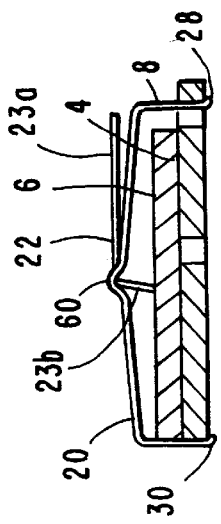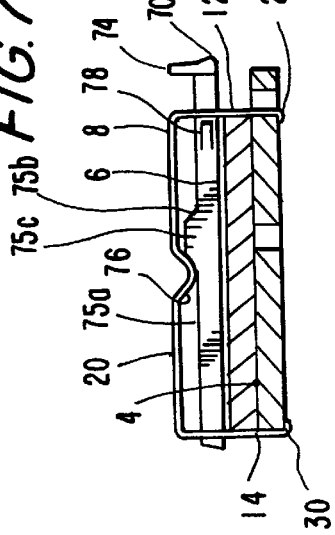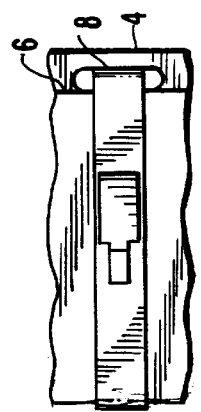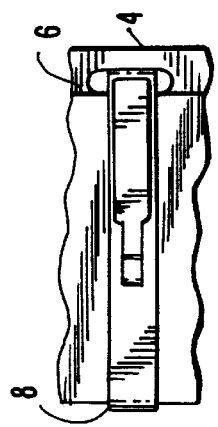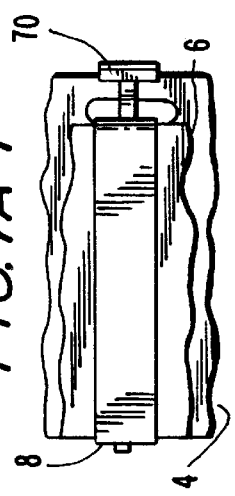

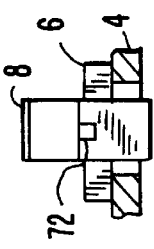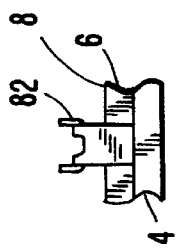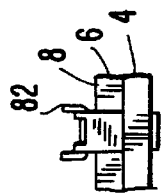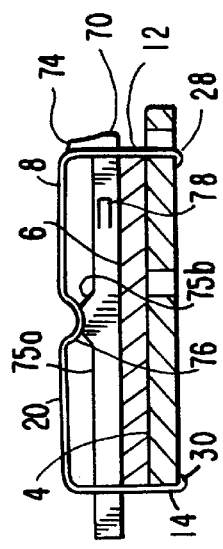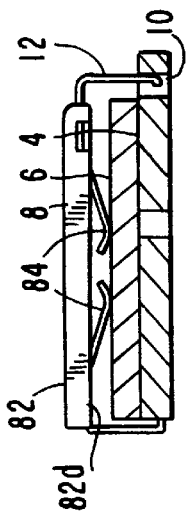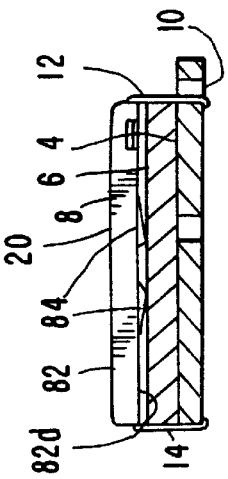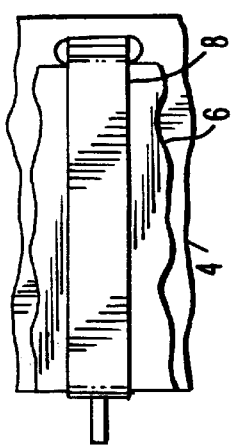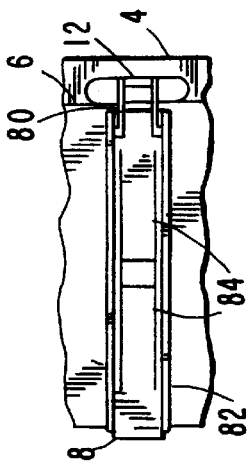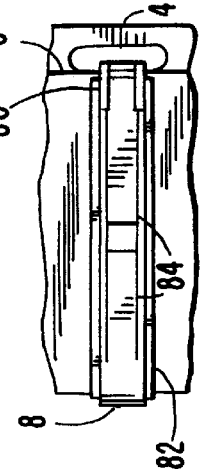

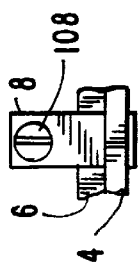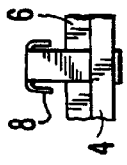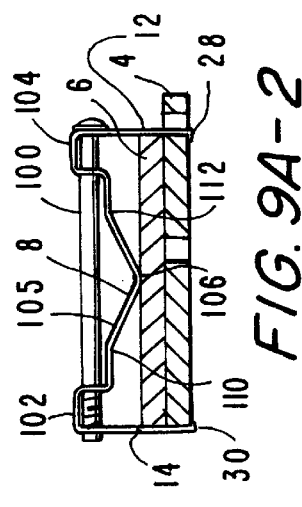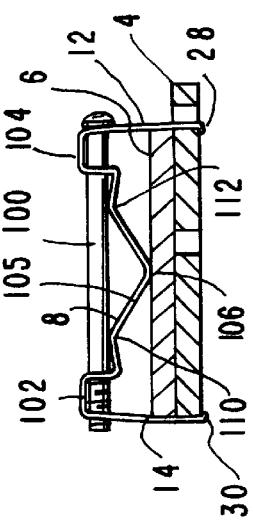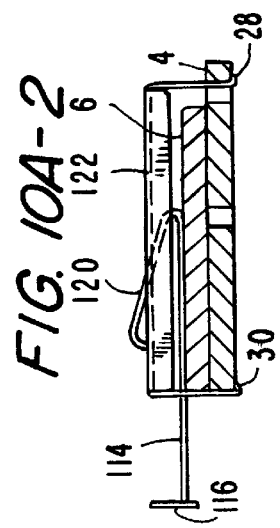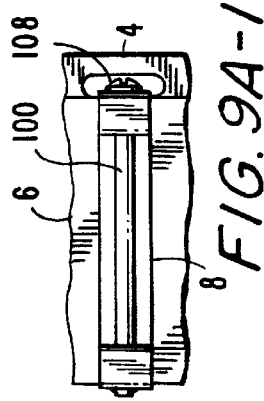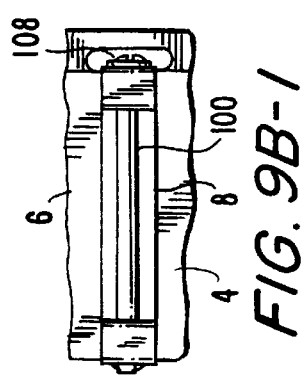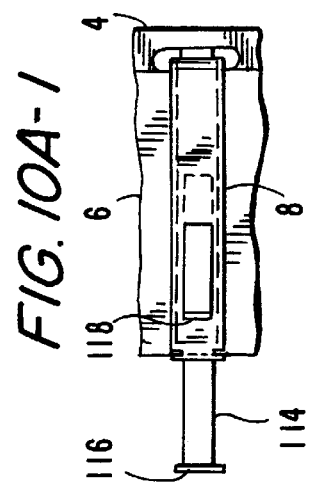

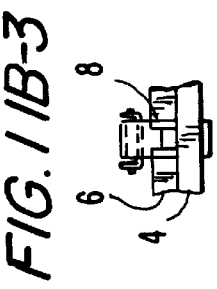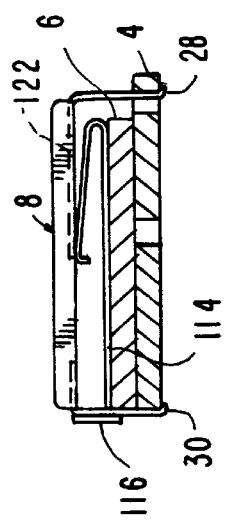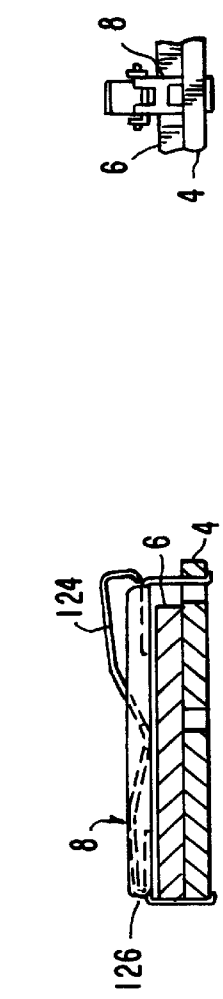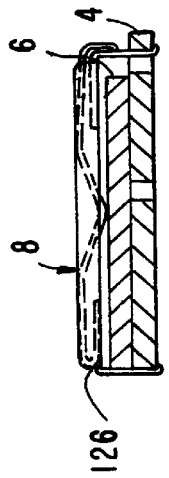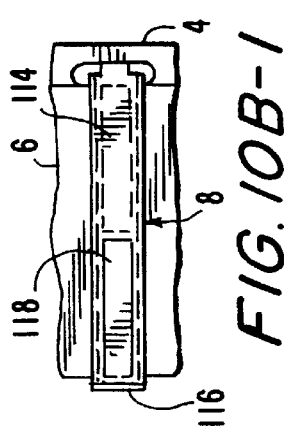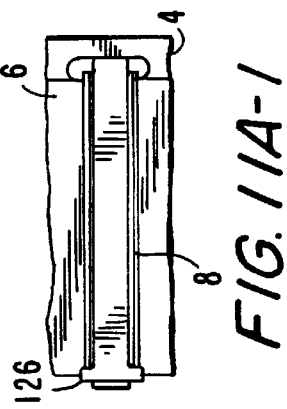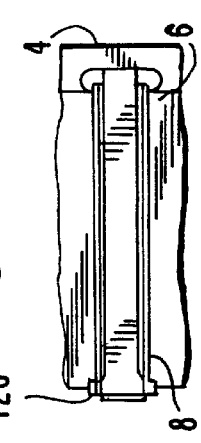

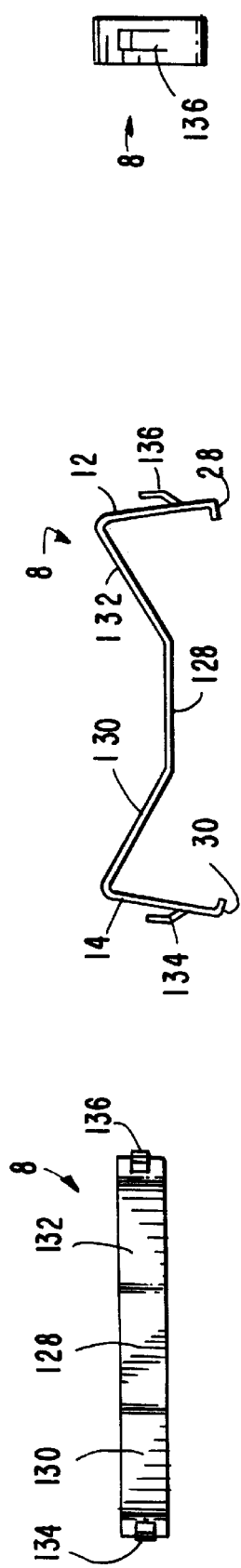

HEAT DISSIPATION SYSTEM HAVING RELEASABLE ATTACHMENT ASSEMBLY

CROSS-REFERENCE TO RELATED PROVISIONAL APPLICATION

This application claims the benefit of U.S. provisional application Ser. No. 60/038,035 filed on Feb. 6, 1997.

BACKGROUND OF THE INVENTION

1. Field of the Invention

This invention relates to heat dissipation systems for electronic device packages. More particularly, it relates to a heat dissipation system having a releasable attachment assembly for releasably securing a heat sink to a heat spreader plate mounted to the electronic device package.

2. Description of Related Art

Many electronic devices and electrical systems such as power controls, switches, variable speed motor controls, microprocessors and the like generate heat during operation. To avoid damage to the device and/or impairment of its operating characteristics, this heat must be dissipated. Accordingly, devices, commonly referred to as "heat sinks", which remove and dissipate excess thermal energy are often necessary to ensure proper operation of electronic devices and other heat-generating systems.

For purposes of the present invention, a heat sink is any body of metal or other thermally conductive material which is placed in thermal contact with an electronic device, device package or other heat-generating system for the purpose of receiving internally generated heat from the device and dissipating the received heat to the surrounding environment by conduction, convection and/or radiation. In order to accomplish this objective, it is generally preferred that heat sinks are constructed of materials having high coefficients of thermal conduction, for example, aluminum, copper and alloys thereof.

A typical heat sink for electrical applications functions by conducting heat away from the heat-generating device and dissipating the heat into the surrounding air. In order for the heat sink to operate efficiently, it must be secured to, or otherwise placed in thermal contact with, the heat-generating component. In the past, various techniques have been used to securedly place heat sinks in thermal contact with electronic devices. For example, it is known to glue or otherwise adhesively mount a heat sink to a predetermined surface of an electronic device, for example, using a heat-conductive epoxy or the like. The art also discloses heat sinks mounted to electronic devices by connective devices, for example, resilient metal clips, screws, bolts and clamps which urge the heat sink and electronic device package into mutual contact.

Technological advances have caused electronic components to decrease in size but increase in power and speed. As a result, therefore, electronic devices occupy less space but tend to generate more heat as a function of surface area. As the electronic devices have less physical structure or surface area for attaching a heat sink to dissipate generated heat, the design of heat sinks has increased in complexity. To provide increased surface area to mount heat sinks in thermal communication with the electronic devices, a heat spreader plate can be used between the heat sink and the electronic device. Such a heat spreader serves to disperse the heat generated by the electronic device throughout a larger physical structure than the device itself, thus allowing a larger heat sink to be mounted in thermal communication with the electronic device via the heat spreader plate. The heat spreader plate also provides a common support structure to which various alternative electronic device packages as well as alternative heat sinks can be mounted using a mounting assembly, socket, or the like.

While the heat spreader plate provides a common support structure, it is highly desirable that the remainder of the assembly which attaches a heat sink to an electronic device be standardized as well. By doing so, flexibility during selection of a heat sink would be greatly enhanced. It is, therefore, the object of the invention to provide a heat dissipation system having a releasable attachment assembly arranged in the manner disclosed herein.

SUMMARY OF THE INVENTION

In accordance with the present invention, there is provided a heat dissipation system having a releasable attachment assembly for releasably securing a heat sink to a heat spreader plate which, in turn, is secured to an electronic device package. The heat dissipation system includes a heat sink having a base plate with pins, fins, or other protrusions extending from a lower body portion thereof. The heat sink has channels formed between the pins or fins of the heat sink to enable placement of a spring clips in each such channel. The spring clips are used to releasably secure the heat sink to a heat spreader plate. When engaged, the spring clips are biased to urge the heat sink into thermal contact with the heat spreader plate. As the spring clips releasably secure the heat sink to the heat spreader plate, the heat sink may be readily removed and/or replaced. Further, a variety of channeled heat sinks may be used to form the heat dissipation system.

The spring clip used in the heat dissipating assembly is adapted to extend across the heat sink adjacent one opposed edge thereof to the other and to latch in place so that the spring bias holds the heat sink tightly against the heat spreader plate. The spring clip body may provide the requisite spring bias by way of an elongated leaf spring, a hinged spring, or other spring means. In one alternate embodiment thereof, the spring clip body may itself be hinged. In another, the spring clip body may be a substantially rigid beam structure with the biasing force provided elsewhere, for example, by a sliding member having a projection which, when slid into engagement with a downwardly bent portion of the spring clip body, pushes the rigid beam structure upwardly.

The spring clip further includes first and second legs which project downwardly from the body thereof. The remote ends of the legs include feet which, in response to a biasing force produced by the spring clip body, engage a bottom side surface of the heat spreader plate, thereby securedly engaging the heat sink to the heat spreader plate. Depending on the particular biasing force exerted by the spring clip body, it may be preferable for the feet to extend in opposite directions away from each other, the same direction, or opposite directions toward each other. The spring clip further includes a lever arm, coupled to the body of the spring clip and movable between first and second positions to respectively disengage and engage the secured engagement between the heat spreader plate and the heat sink. The lever arm may be formed to include a cam, lever or slide mechanism, the pivoting of which places a biasing force on the spring clip body.

BRIEF DESCRIPTION OF THE DRAWING

The invention will be better understood and its numerous objects and advantages will become apparent to those skilled in the art by reference to the following drawing in which:

FIG. 3A-1 is a partial top view of an alternate embodiment of the heat dissipation system of FIGS. 1–2 with a cam lever shown in a disengaged position;

FIG. 3A-2 is a side view of the heat dissipation system of FIG. 3A-1 with the heat spreader plate shown in cross-section to better illustrate the engagement of the spring clip body therewith;

FIG. 3A-3 is a partial front view of the heat dissipation system of FIG. 3A-1;

FIG. 3B-1 is a partial top view of the heat dissipation system of FIG. 3A-1 with the cam lever pivoted into an engaged position;

FIG. 3B-2 is a side view of the heat dissipation system of FIG. 3B-1 with the heat spreader plate shown in cross-section to better illustrate the engagement of the spring clip body therewith;

FIG. 3B-3 is a partial front view of the heat dissipation system of FIG. 3B-1;

FIG. 4A-1 is a partial top view of another alternate embodiment of the heat dissipation system of FIGS. 1–2 with a cam lever shown in a disengaged position;

FIG. 4A-2 is a side view of the heat dissipation system of FIG. 4A-1 with the heat spreader plate shown in cross-section to better illustrate the engagement of the spring clip body therewith;

FIG. 4A-3 is a partial front view of the heat dissipation system of FIG. 4A-1;

FIG. 4B-1 is a partial top view of the heat dissipation system of FIG. 4A-1 with the cam lever pivoted into an engaged position;

FIG. 4B-2 is a side view of the heat dissipation system of FIG. 4B-1 with the heat spreader plate shown in cross-section to better illustrate the engagement of the spring clip body therewith;

FIG. 4B-3 is a partial front view of the heat dissipation system of FIG. 4B-1;

FIG. 5A-1 is a partial top view of still another alternate embodiment of the heat dissipation system of FIGS. 1–2 with a cam lever shown in a disengaged position;

FIG. 5A-2 is a side view of the heat dissipation system of FIG. 5A-1 with the heat spreader plate shown in cross-section to better illustrate the engagement of the spring clip body therewith;

FIG. 5A-3 is a partial front view of the heat dissipation system of FIG. 5A-1;

FIG. 5B-1 is a partial top view of the heat dissipation system of FIG. 5A-1 with the cam lever pivoted into an engaged position;

FIG. 5B-2 is a side view of the heat dissipation system of FIG. 5B-1 with the heat spreader plate shown in cross-section to better illustrate the engagement of the spring clip body therewith;

FIG. 5B-3 is a partial front view of the heat dissipation system of FIG. 5B-1;

FIG. 6A-1 is a partial top view of still yet another alternate embodiment of the heat dissipation system of FIGS. 1–2 with an angled lever arm shown in a disengaged position;

FIG. 6A-2 is a side view of the heat dissipation system of FIG. 6A-1 with the heat spreader plate shown in cross-section to better illustrate the engagement of the spring clip body therewith;

FIG. 6A-3 is a partial front view of the heat dissipation system of FIG. 6A-1;

FIG. 6B-1 is a partial top view of the heat dissipation system of FIG. 5A-1 with the angled lever arm pivoted into an engaged position;

FIG. 6B-2 is a side view of the heat dissipation system of FIG. 6B-1 with the heat spreader plate shown in cross-section to better illustrate the engagement of the spring clip body therewith;

FIG. 6B-3 is a partial front view of the heat dissipation system of FIG. 6B-1;

FIG. 7A-1 is a partial top view of still another alternate embodiment of the heat dissipation system of FIGS. 1–2 with a cam slide shown in a disengaged position;

FIG. 7A-2 is a side view of the heat dissipation system of FIG. 7A-1 with the heat spreader plate shown in cross-section to better illustrate the engagement of the spring clip body therewith;

FIG. 7A-3 is a partial front view of the heat dissipation system of FIG. 7A-1;

FIG. 7B-1 is a partial top view of the heat dissipation system of FIG. 7A-1 with the cam slide slid into an engaged position;

FIG. 7B-2 is a side view of the heat dissipation system of FIG. 7B-1 with the heat spreader plate shown in cross-section to better illustrate the engagement of the spring clip body therewith;

FIG. 7B-3 is a partial front view of the heat dissipation system of FIG. 7B-1;

FIG. 8A-1 is a partial top view of still yet another alternate embodiment of the heat dissipation system of FIGS. 1–2 with a sliding latch shown in a disengaged position;

FIG. 8A-2 is a side view of the heat dissipation system of FIG. 8A-1 with the heat spreader plate shown in cross-section to better illustrate the engagement of the spring clip body therewith;

FIG. 8A-3 is a partial front view of the heat dissipation system of FIG. 8A-1;

FIG. 8A-1 is a partial top view of the heat dissipation system of FIG. 8A-1 with the sliding latch slid into an engaged position;

FIG. 8B-2 is a side view of the heat dissipation system of FIG. 8B-1 with the heat spreader plate shown in cross-section to better illustrate the engagement of the spring clip body therewith;

FIG. 8B-3 is a partial front view of the heat dissipation system of FIG. 8B-1;

FIG. 9A-1 is a partial top view of still another alternate embodiment of the heat dissipation system of FIGS. 1–2 with a screw-biased spring clip shown in a disengaged position;

FIG. 9A-2 is a side view of the heat dissipation system of FIG. 9A-1 with the heat spreader plate shown in cross-section to better illustrate the engagement of the spring clip body therewith;

FIG. 9A-3 is a partial front view of the heat dissipation system of FIG. 9A-1;

FIG. 9B-1 is a partial top view of the heat dissipation system of FIG. 9A-1 with the screw-biased spring clip biased into an engaged position;

FIG. 9B-2 is a side view of the heat dissipation system of FIG. 9B-1 with the heat spreader plate shown in cross-section to better illustrate the engagement of the spring clip body therewith;

FIG. 9B-3 is a partial front view of the heat dissipation system of FIG. 9B-1;

FIG. 10A-1 is a partial top view of still yet another alternate embodiment of the heat dissipation system of FIGS. 1–2 with a sliding spring clip shown in a disengaged position;

FIG. 10A-2 is a side view of the heat dissipation system of FIG. 10A-1 with the heat spreader plate shown in cross-section to better illustrate the engagement of the spring clip body therewith;

FIG. 10A-3 is a partial front view of the heat dissipation system of FIG. 10A-1;

FIG. 10B-1 is a partial top view of the heat dissipation system of FIG. 10A-1 with the sliding spring clip slid into an engaged position;

FIG. 10B-2 is a side view of the heat dissipation system of FIG. 10B-1 with the heat spreader plate shown in cross-section to better illustrate the engagement of the spring clip body therewith;

FIG. 10B-3 is a partial front view of the heat dissipation system of FIG. 10B-1;

FIG. 11A-1 is a partial top view of still another alternate embodiment of the heat dissipation system of FIGS. 1–2 with a latching spring clip shown in a disengaged position;

FIG. 11A-2 is a side view of the heat dissipation system of FIG. 11A-1 with the heat spreader plate shown in cross-section to better illustrate the engagement of the spring clip body therewith;

FIG. 11A-3 is a partial front view of the heat dissipation system of FIG. 11A-1;

FIG. 11B-1 is a partial top view of the heat dissipation system of FIG. 11A-1 with the latching spring clip latched into an engaged position;

FIG. 11B-2 is a side view of the heat dissipation system of FIG. 11B-1 with the heat spreader plate shown in cross-section to better illustrate the engagement of the spring clip body therewith;

FIG. 11B-3 is a partial front view of the heat dissipation system of FIG. 11B-1;

FIG. 12A is a top view of an alternate embodiment of the spring clip of the heat dissipation system of FIGS. 1 through 11B-3;

FIG. 12B is a side view of the spring clip of FIG. 12A; and

FIG. 12C is a front view of the spring clip of FIG. 12A.

DESCRIPTION OF THE PREFERRED EMBODIMENTS

Figure 1:
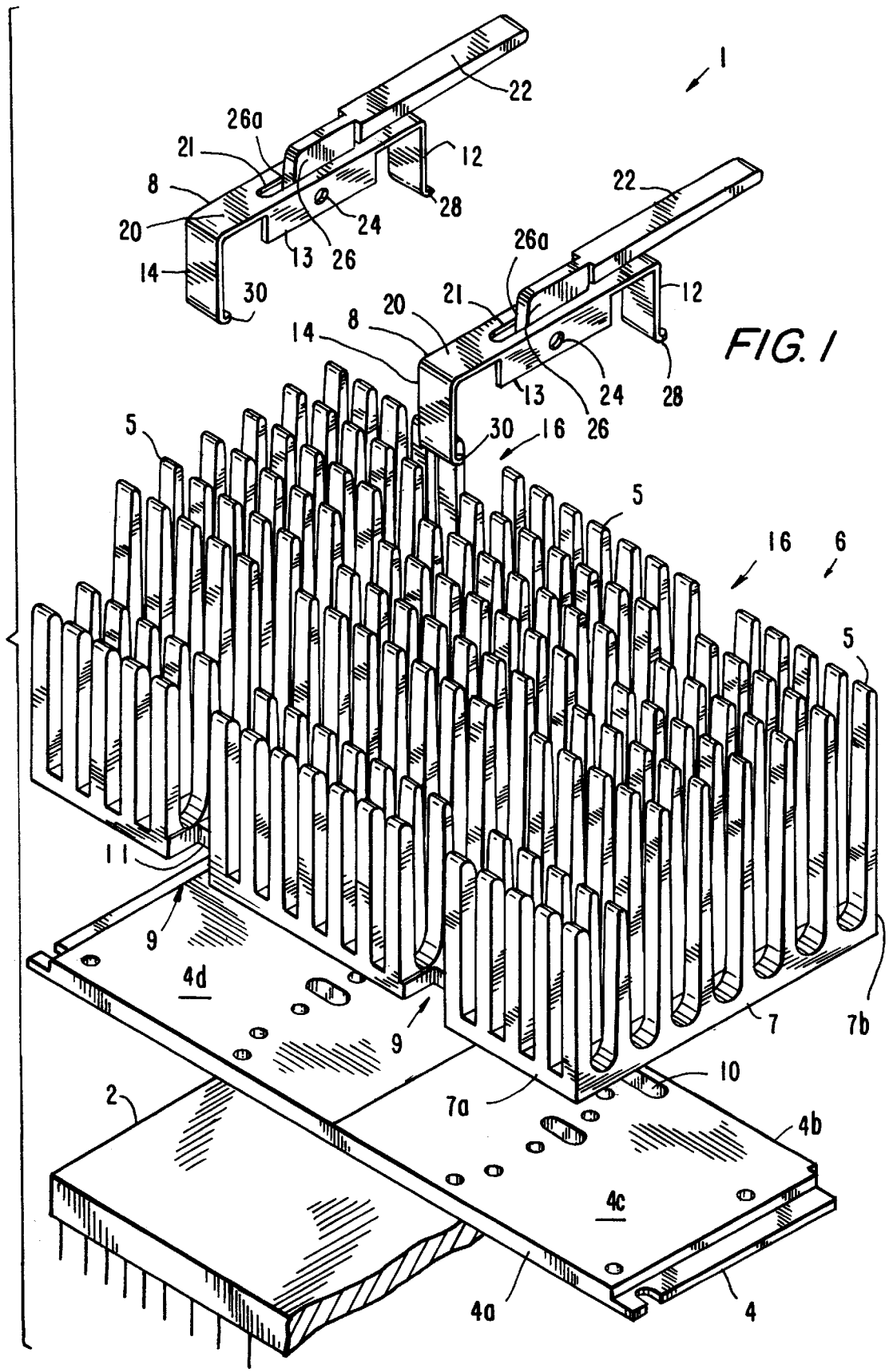
FIG. 1 is an exploded top view of a heat dissipation system having a releasable attachment assembly constructed in accordance with the teachings of the present invention.
Figure 2:
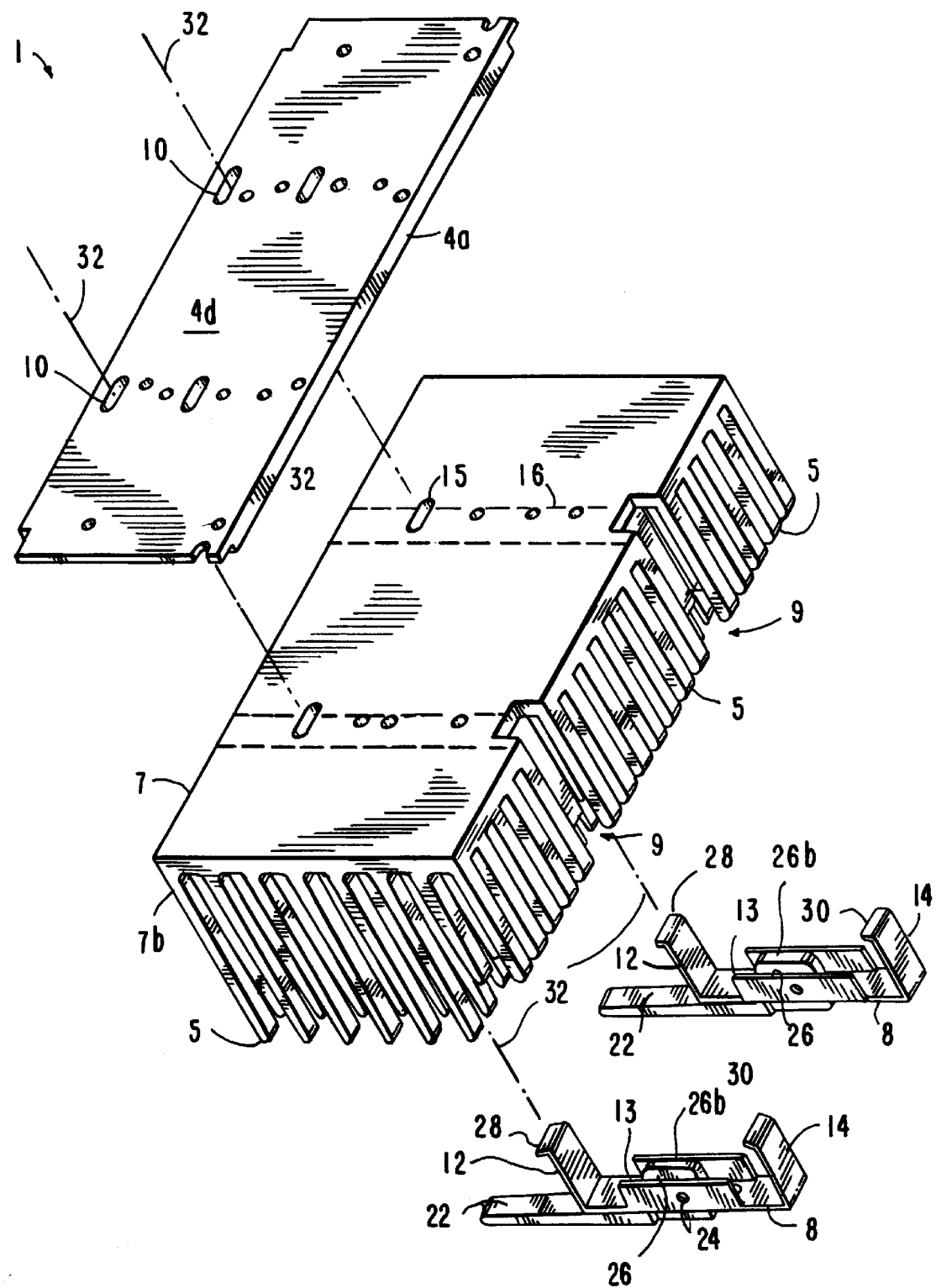
FIG. 2 is an exploded bottom view of the heat dissipation system of FIG. 1.

Referring first to FIGS. 1 and 2, a heat dissipation system having a releasable attachment assembly and constructed in accordance with the teachings of the present invention may now be seen. The heat dissipation system 1 includes a heat spreader plate 4 and one or more spring clips 8 which, as will be more fully described below, biases a heat sink 6 into releasable engagement with the heat spreader plate 4 which, in turn, is conventionally mounted onto an electronic device package 2. As illustrated herein, the heat sink 6 is comprised of a thermally conductive material such as aluminum, aluminum alloy, copper or the like and comprised of a body portion 7 and an array of elongated pins 5 which project upwardly from the body portion 7. Longitudinally extending from first edge side surface 7a to second edge side surface 7b of the heat sink 6 are "channels" 16. By the term "channels", it is intended to refer to elongated longitudinally extensive sections of the body portion 7 characterized by the absence of the pins 5 which populate the remainder of the body portion 7. As illustrated herein, the heat sink 6 includes a pair of channels 16 longitudinally extending thereacross. However, any heat sink 6 formed to include one or more channels will be suitable for the purposes contemplated herein. Furthermore, while the heat sink 6 is of the pin grid array type, it is specifically contemplated that various other types of heat sinks may be used in place of that illustrated herein.

The spring clips 8 releasably mount the heat sink 6 to the heat spreader plate 4. More specifically, after the heat sink 6 is supportably placed on a top side surface 4c of the heat spreader plate 4 and positioned such that front edge surfaces 11 are aligned with a first side surface 4a of the heat spreader plate 4, each spring clip 8 is inserted into a corresponding one of the channels 16, thereby passing the pins 5, until a central member 13 of the spring clip 8 engages the body portion 7 along the channel 16, a first leg 12 is received in an aperture 10 formed in the heat spreader plate 4 and a second leg 14 extends over the first edge side surface 4a and beyond a bottom side surface 4d thereof. As shown in FIG. 2, guide lines 32 depict how the spring clips 8, heat sink 6, and heat spreader plate 4 are aligned for assembly. From this view, one can more clearly see that the body portion 7 of the heat sink 6 is pressed flush with the upper side surface 4a of the heat spreader plate 4 such that the apertures 10 in the heat spreader plate 4 are aligned with the apertures 15 in the body portion 7 of the heat sink to accept the first legs 12 of spring clips 8. The spring clips 8 are then biased such that a first foot 28 formed on a remote end of the first leg 12 and a second foot 30 formed on a remote end of the second leg 14 securely engage the bottom side surface 4d of the heat spreader plate 4, thereby securely mounting the heat sink 6 to the heat spreader plate 4.

Continuing to refer to FIGS. 1 and 2, each spring clip 8 includes a spring clip body 20 (from which the first and second legs 12 and 14 downwardly depend) having a slot 21 in which a lever arm 22 is insertably mounted by pivot pin 24. A lower portion of the lever arm 22 which extends through the slot 21 forms a cam 26 having a profile which, when rotated by moving the lever arm 22, urges the spring clip body 20 upwardly which, in turn, presses the first foot 28 and the second foot 30 into secured engagement with the bottom side surface 4d of the heat spreader plate 4. The profile of the cam 26 includes first and second faces 26a and 26b, the first face 26a being spaced a first distance from an interior location for the cam 26 where the pivot pin 24 secures the cam 26 to the central member 13 of the spring clip 8 and the second face 26b being spaced a second distance, greater than the first distance, from the interior location for the cam 26.

More specifically, when the lever arm 22 is in a first, disengaged, position (not shown in FIGS. 1 and 2), an elongated portion of the lever arm 22 is generally orthogonal to the body 20 of the spring clip 8 and the cam 26 does not securely engage the body portion 7 of the heat sink 6. When the elongated portion of the lever arm 22 is moved to a second, engaged, position, generally parallel to the body 20 of the spring clip 8, the cam 26 engages the body portion 7 of the heat sink 6 to press the body portion 7 of the heat sink 6 between the cam 26 and the heat spreader plate 4, thereby urging the heat sink 6 and heat spreader plate 4 into enhanced thermal contact. In order to allow a user ready access to pivot the lever arm 22 between the first and second positions, it is preferred that the lever arm 22 is suitably dimensioned along its length such that it extends beyond the pins 5 of the heat sink 6. While it would still be possible for the user to manipulate lever arms of shorter lengths, such manipulation may be unnecessarily difficult, particularly if the channels 5 are relatively narrow.

To secure the heat sink 6 to the heat spreader plate 4 using the spring clips 8, thereby assembling the disclosed heat dissipation system, the heat sink 6 is first positioned on the heat spreader plate 4 with the body portion 7 thereof in thermal contact with the heat spreader plate 4 and the exposed edge side surfaces 11 aligned with the first edge side surface 4d. A spring clip 8 positioned such that its lever arm is generally orthogonal to the body 20 thereof is inserted into each channel 16 of the heat sink 6, until the central member 13 of the spring clips 8 engage the body portion 7 of the heat sink 6 (if the first distance which spaces the cam face 26a is less than the height of the central member 13) or until the cam face 26a engages the body portion 7 of the heat sink 6 (if the first distance which spaces the cam face 26a is greater than the height of the central member 13). The first and second legs 12 and 14 of the spring clips 8 are sized, relative to the height of the central member 13 (or the first distance spacing the cam face 26a) such that, when the central member 13 (or the cam face 26a) engages the body portion 7, the first legs 12 have projected through the apertures 10 of the heat spreader plate 4 while the second legs 14 extend below the lower side surface 4d of the heat spreader plate 4 such that the first and second feet 28 and 30 are generally adjacent the lower side surface 4d of the heat spreader plate 4. The lever arm 22 is then pivoted into the engaged position shown in FIGS. 1 and 2. As the cam 26 is rotated, the cam face 26b, which, as previously set forth, outwardly projects further than the cam face 26a, begins to press against the body portion 7 of the heat sink 6. This pressing of the cam face 26b against the heat sink 6 upwardly biases the body 20 of the spring clip 8, which acts as an elongated leaf spring. As the first and second feet 28 and 30 are adjacent the lower side surface 4d of the heat spreader plate 4, this upwards bias of the body 20 of the spring clip body 20 securely engages the heat sink 6 to the heat spread plate 4 by biasing the first and second feet 28 and 30 into a secured thermally conductive engagement with the lower side surface 4d of the heat spreader plate 4. Preferably, the edge separating the first and second cam faces 26a and 26b of the cam profile is beveled such that, as the cam 26 is pivoted into the engaged position, the lever arm will lock into position.

Before continuing with further description of the present invention, certain dimensional relationships between the heat spreader plate 4, the heat sink 6 and the spring clips 8 will now be discussed. As disclosed herein, the leg 12 of the spring clip is received in the aperture 10 formed in the heat spreader plate 4. As it is contemplated that the disclosed releasable attachment assembly may be used to removably mount variously configured and dimensioned heat sinks, for example, the heat sink 6, to the heat spreader plate 4, depending on the dimensional relationships between the heat sink 6 and the heat spreader plate 4, the configuration of the two may be varied somewhat. Specifically, as disclosed herein, when the heat sink 6 is mounted to the heat spreader plate 4, the leg 12 of the spring clip 8 is received in an aperture 10 formed in the heat spreader plate 4. However, the lengthwise dimension of the heat sink relative to the heat spreader plate may cause the precise manner as to how receipt of the leg 12 in the aperture 10 is achieved. If the lengthwise dimension of the heat sink 6 is equal to or less than the lengthwise dimension of the heat spreader plate 4, when a first edge side surface of the heat sink 6 is aligned with the first edge side surface 4a of the heat spreader plate 4, a portion of the heat spreader plate 4 which extends from a second edge side surface 4b and past the apertures 10 will be exposed, thereby enabling access to the aperture 10 for the leg 12. If, however, the lengthwise dimension of the heat sink is greater than the lengthwise dimension of the heat spreader plate 4, the heat sink, for example, the heat sink 6 illustrated in FIGS. 1–2, should be formed to include an aperture 15, positioned along the channel 16 and extending through the body 7 thereof, through which the leg 12 passes prior to being received in the aperture 10 of the heat spreader plate 4. To further enhance attachment of the heat sink 6 to the heat spreader plate 4, the heat sink 6 may further include indents 9 which expose the front edge surfaces 11 to be aligned with the first edge surface 4a of the heat spreader plate 4. By further including the indents 9, the spring clip 8 will be better secured against lateral pressure which, absent the indents 9, could inadvertently cause the spring clip 8 to disengage.

Of course, the lengthwise dimension of the heat sink 6 relative to that of the heat spreader plate 4 may be varied without departing from the scope of the present invention. For example, while the lengthwise dimension of the heat sink 6, as illustrated in FIGS. 1 through 2, is greater than that of the heat spreader plate 4, in FIGS. 3A-1 through 11B-3, the lengthwise dimension of the heat sink 6 is less than that of the heat spreader plate 4. Similarly, in FIGS. 1 through 2, the heat sink 6 is provided with indents 9 which expose the front edge surfaces 11 which are aligned with the first edge side surface 4a of the heat spreader plate 4 while, in FIGS. 3A-1 through 11B-3, indents are not formed in the heat sink 6 and the front edge side surface 7a of the heat sink 6 is aligned with the first edge side surface 4a of the heat spreader plate 4.

Referring next to FIGS. 3A-1 through 3B-3, an alternate embodiment of the heat dissipation system may now be seen. In this embodiment, the lever arm 22 has a relatively thin main body portion 36 with a finger tab 38 on its remote end. As before, the lever arm 22 is still rotatably connected to the body 20 of the spring clip 8 by the pivot pin 24. Here, however, the body 20 of the spring clip 8 is also thinner than the body 20 of the spring clip 8 depicted in FIGS. 1–2. FIGS. 3A-1 through 3A-3 show the spring clip 8 in a disengaged position where the cam face 26a lies flush with an upper side surface of the heat sink 6 while FIG. 3B-1 through 3B-3 show the spring clip 8 in an engaged position in which, by pivoting the lever arm 22 so that the wider cam face 26b biases the first and second feet 28 and 30 into engagement with a bottom side surface of the heat spreader plate 4.

Referring next to FIGS. 4A-1 through 4B-3, another alternate embodiment of the heat dissipation system may now be seen. In this embodiment, the spring clip body 20 of the spring clip 8 is formed as a jointed spring rather than the elongated leaf spring shown in FIGS. 1 through 3B-3. More specifically, the spring clip body 20 is now comprised of first and second spring members 21a and 21b joined to each other by the pivot pin 24. The jointed spring clip body 20 performs essentially the same function, i.e., to provide spring bias to securely engage the heat sink 6 to the heat spreader plate 4 in good thermal contact. As a result of the jointed spring clip body 20, the pivot pin 24 serves not only to rotatably couple the lever arm 22 to the jointed spring clip body 20, but also serves as a pivot pin for the jointed spring clip body 20 itself. Similar to the embodiment illustrated in FIGS. 3A-1 through 3B-3, the lever arm 22 has a relatively thin main body portion 36 with a finger tab 38 on its remote end. Again, as before, FIGS. 4A-1 through 4A-3 show the spring clip 8 in a disengaged position where the cam face 26a lies flush with an upper side surface of the heat sink 6 while FIG. 4B-1 through 4B-3 show the spring clip 8 in an engaged position in which, by pivoting the lever arm 22 so that the wider cam face 26b biases the first and second feet 28 and 30 into engagement with a bottom side surface of the heat spreader plate 4.

Referring next to FIGS. 5A-1 through 5B-3, still another alternate embodiment of the heat dissipation system may now be seen. In this embodiment, the similarly profiled cam 26 of the lever arm 22 is adapted to perform as a spring by removing a first, interior, portion of the cam 26 such that the remaining portion of the cam 26 will be deformed when rotated from the first cam face 26a to the second cam face 26b. In this embodiment, when the lever arm 22 is engaged, i.e. rotated from a first position shown in FIGS. 5A-1 through 5A-3 to a second position shown in FIGS. 5B-1 through 5B-3, the cam 26, rather than the spring clip body 20, deforms to generate a spring biasing force which is propagated to the spring clip body 20 to secure the heat sink 6 to the heat spreader plate 4 by pressing the first and second feet 28 and 30 against the bottom side surface of the heat spreader plate. To prevent the spring body 20 from also deforming, and thereby relieve the spring pressure created by the deformed spring formed in the cam 26, the spring clip body 20 is formed as a substantially rigid beam rather than a spring.

Referring next to FIGS. 6A-1 through 6B-3, still yet another alternate embodiment of the heat dissipation system may now be seen. In this embodiment, the cam 26 of the embodiments illustrated in FIGS. 1 through 5B-3 has been eliminated in favor of a angled lever arm 22 having a first, elongated, lever portion 23a and a second, shorter, lever portion 23b, obtusely angled relative to each other at the pivot connection with the spring clip body 20. In this embodiment, when the angled lever arm 22 is engaged, i.e. rotated from a first position illustrated in FIGS. 6A-1 through 6A-3 to a second position illustrated in FIGS. 6B-1 through 6B-3, for example, by depressing the first lever portion 23a, the second lever portion 23b of the angled lever arm 22 presses against the heat sink 6. In turn, this pressure causes the spring clip body 20 to deform, thereby creating a spring bias which urges the heat spreader plate 4 into a secured engagement with the heat sink 6. It should be further noted that the bend formed in the lever arm 22 effectively latches the lever arm 22 in the engaged or second position. Further, by use of the angled lever arm 22, the pivot pin 24 is no longer required to rotatably connect the lever arm 22 to the spring clip body 20. Instead, a simple pivot point 60 can be formed between the lever arm 22 and the spring clip body 20.

Referring next to FIGS. 7A-1 through 7B-3, still another alternate embodiment of the heat dissipation system may now be seen. In this embodiment, the lever arm 22 and the cam 26 of the embodiments illustrated in FIGS. 1 through 6B-3 have been eliminated in favor of a sliding member 70. The sliding member 70 is slidably mounted through slots in the first and second legs 12 and 14 of the spring clip 8. A finger tab 74 is formed at one end of the sliding member 70 to enable the user to readily grasp the sliding member 70. As best seen in FIGS. 7A-2 and 7B-2, the sliding member is comprised of an elongated body portion 75a having a ramped projection 75b in the general center thereof. When, using the finger tab 74, the sliding member 70 is slid from the disengaged position shown in FIGS. 7A-1 through 7A-3 into the engaged position shown in FIGS. 7B-1 through 7B-3, the ramped projection 75b engages a dog 76 formed in the general center of the spring clip body 20 As the dog 76 rides up the ramped projection 75b, an upward force is exerted on the spring clip body 20, thereby biasing the first and second feet 28 and 30 into engagement with the bottom side surface of the heat spreader plate 4, thereby securedly engaging the heat spreader plate 4 with the heat sink 6. Preferably, the ramped projection includes a small detent 75c which latches the sliding member 70 in the engaged position. To disengage, the sliding member 70 is pulled out from the spring clip 8. The dog 76 is pulled out of the detent 75c and then rides back down the ramped projection 70 to release the spring force biasing the heat spreader plate 4 into secured engagement with the heat sink 6. If desired, a stop 78 may be formed on the sliding member 70 to limit travel of the sliding member 70 such that it cannot be completely removed from the spring clip 8.

Referring next to FIGS. 8A-1 through 8B-3, still yet another alternate embodiment of the heat dissipation system may now be seen. In this embodiment, the spring clip body is comprised of a substantially rigid beam 82 having two leaf springs formed in the rigid beam 82. The leaf springs 84 extend angularly down from a lower side surface 82d of the rigid beam 82 towards the main body portion of the heat sink 6. In further accordance with this embodiment of the heat dissipation system, the first leg 12 of the spring clip 8 is attached to the spring clip body 20 via a sliding latch mechanism 80. The sliding latch 80 allows the first leg 12 to slide in and out along a direction parallel to the longitudinal axis of the spring clip body 20. As a result, therefore, a user may manually increase and/or decrease the distance between the first leg 12 and second leg 14.

To install this embodiment of the spring clip 8, the first leg 12 must be slid into a first position shown in FIGS. 8A through 8A-3 which allows the first leg 12 to be inserted into the aperture 10 formed in the heat spreader plate 4 and the second leg 14 to extend along the first edge side surface 4a. Once the first and second legs 12 and 14 are positioned in this manner, the spring clip body 20 is manually pressed towards the heat sink 6, thereby compressing the leaf springs 84. The user should continue pressing the spring clip body 20 in this manner until the first and second feet 28 and 30 of the first and second legs 12 and 14 extend beyond the heat spreader plate 4. Once the first and second feet 28 and 30 are beyond the heat spreader plate 4, th user slides the first leg 12 towards the second leg 14, latches the first leg 12 into the engaged position shown in FIGS. 8B-1 through 8B-3 and then releases the manual pressure on the spring clip body 20. As the leaf springs 84 exert a biasing force opposing depression of the spring clip body 20 and since the first and second feet 28 and 30 of the first and second legs 12 and 14, respectively, have been positioned below the bottom side surface of the heat spreader plate 4, the biasing force exerted by the leaf springs drives the first and second feet 28 and 30 into engagement with the bottom side surface 4d of the heat spreader plate 4. With the feet 28 and 30 latched to the heat spreader plate 4 in this manner, the compressed leaf springs 84 continues to exert a biasing force against the heat sink 6 which urges the heat sink 6 and the heat spreader plate 4 into a secured, thermally conductive, engagement.

Referring next to FIGS. 9A-1 through 9B-3, still another alternate embodiment of the heat dissipation system may now be seen. In this embodiment, the spring clip 8 is formed to include first and second joints 102 and 104 at opposite ends thereof and a downwardly descending portion 105 therebetween. A machine screw 100 extends through first and second apertures formed in each of the first and second joints 102 and 104. When placed in the channel 16, a lowermost point 106 of the downwardly descending portion 105 engages the heat sink 6. To securely engage the heat spreader plate 4 into thermal contact with the heat sink 6, the machine screw 100 is rotated in a clockwise direction, for example, by turning a head portion 108 of the machine screw 100 to move the spring clip 8 out of a disengaged position shown in FIGS. 9A-1 through 9A-3 and into an engaged position shown in FIGS. 9B-1 through 9B-3. More specifically, by rotating the machine screw 100, the first and second joints 102 and 104 are pinched. As a result, therefore, points 110 and 112 of the downwardly descending portion 105 are driven into contact with the machine screw 100, thereby producing an upwardly biasing force on the legs 12 and 14 which pulls the first and second feet 28 and 30 into a secured engagement with the bottom side surface of the heat spreader plate 4.

Referring next to FIGS. 10A-1 through 10B-3, still another alternate embodiment of the heat dissipation system may now be seen. Similar to the embodiment shown in FIGS. 7A-1 through 7B-3, in this embodiment, the spring clip 8 again includes a sliding member 114. having a finger tab 116 for moving the sliding member 114 between the disengaged position shown in FIGS. 10A-1 through 10A-3 and the engaged position shown in FIGS. 10B-1 through 10B-3. In this embodiment, however, the sliding member 114 is formed in the shape of a bent lever arm while the body of the spring clip 8 is formed as a rigid beam 122 having a slot 118 formed therein. In the disengaged position shown in FIGS. 10A-1 through 10A-3, a bent portion 120 of the sliding member 114 extends through the slot 118 at an acute angle relative to the remainder of the sliding member 114. When the sliding member 114 is moved into the engaged position shown in FIGS. 10B-1 through 10B-3, the bent portion 120 of the sliding member 114 is compressed by the rigid beam 122. Compression of the bent portion 120 generates a spring force which upwardly urges the rigid beam 122 which, in turn, causes the feet 28 and 30 to be securely engaged to the lower side surface of the heat spreader plate 4.

Referring next to FIGS. 11A-1 through 11B-3, still another alternate embodiment of the heat dissipation system may now be seen. In this embodiment, the spring clip 8 includes a depressible spring lever arm 124 attached, at one end, to the spring clip body 126. When the spring clip 8 is moved from the disengaged position shown in FIGS. 11A-1 through 11A-3 to the engaged position shown in FIGS. 11B-1 through 11B-3 by depressing the spring lever arm 124, the spring lever arm 124 produces a force on the spring clip body 126 which upwardly urges the legs 12 and 14. As a result, therefore, the feet 28 and 30 are pulled into a tight engagement with the lower side surface of the heat spreader plate 4, thereby securedly engaging the heat sink 6 and the heat spreader plate 4.

Referring next to FIGS. 12A through 12C, an alternate embodiment of the spring clip 8 of the heat dissipation system of FIGS. 1 through 11B-3 may now be seen. Similar to the embodiments previously described, the spring clip 8 includes first and second legs 12 and 14, each with a respective foot 28 and 30 at the remote end thereof. The spring clip body, however is comprised of a central portion 128 and first and second angled portions 130 and 132 extending upwardly from opposite ends of the central portion 128 at an acute angle thereto. To securely engage the heat spreader plate 4 and the heat sink 6, the spring clip 8 is inserted in a channel 16 in a manner identical to that previously described. The tabs 134, 136 facilitate the installation of the spring clip 8 by allowing one to create sufficient torque to align and install the spring clip 8 onto the heat spreader plate 4. Respective downward forces are then exerted on each of the first and second angled portions 130 and 132, thereby forcing the legs 12 and 14 downward until the first and second feet 28 and 30 latch onto the bottom side surface 4d of the heat spreader plate 4. A spring force produced by the first and second angled portions 130 and 132 of the spring clip 8 attempting to return to its original shape causes the first and second feet 28 and 30 to exert an upward biasing force on the heat spreader plate 4 which drives the heat spreader plate 4 into secured engagement with the heat sink 6. Tabs 134 and 136 are pierced, stamped or otherwise formed in the legs 14 and 12, respectively. These tabs 134, 136 allow for the use of a flat screwdriver or other similar tool to manipulate the legs 12, 14 in order to engage the feet 28, 30 onto the heat spreader plate 4.

While the invention has been described with particular reference to specific embodiments thereof, it will be apparent to those skilled in the art that the same principles may be used in similar arrangements. Furthermore, it will be recognized the invention is not limited to the precise structures described. Therefore, it is to be understood that although the invention has been described with particular reference to specific embodiments thereof, the forms of the invention shown and described in detail are to be taken as preferred embodiments of same, and that various changes and modifications may be resorted to without departing from the spirit and scope of the invention as defined by the appended claims.

What is claimed is:

1. A heat dissipation system for a heat generating electronic device, said heat dissipation system comprising:

a heat spreader plate having top and bottom side surfaces;

a heat sink having a main body portion supportably mounted on said top side surface of said heat spreader plate and an array of heat dissipating pins outwardly projecting from said main body portion;

said array of heat dissipating pins arranged to define at least one channel along which said main body portion is accessible; and a spring clip supportably positioned in said channel by said main body portion, said spring clip having first and second downwardly descending members which engage said bottom side surface of said heat spreader plate; and means for removably biasing said downwardly descending members of said spring clip into secured engagement with said bottom side surface of said heat spreader plate.

2. The heat dissipation system of claim 1 wherein:

said heat spreader plate and said heat sink further comprise respective first edge side surfaces;

said first edge side surface of said heat sink being aligned with said first edge side surface of said heat spreader plate when said heat sink is supportably mounted on said heat spreader plate;

said first downwardly descending member of said spring clip extending past said first edge side surface of said heat sink and said first edge side surface of said heat spreader plate.

3. The heat dissipation system of claim 1 wherein:

said heat spreader plate and said heat sink have respective apertures formed therein;

said aperture of said heat sink in communication with said aperture of said heat spreader plate when said heat sink is supportably mounted on said heat spreader plate;

said second downwardly descending member of said spring clip extending through said aperture of said heat sink and said aperture of said heat spreader plate.

4. The heat dissipation system of claim 1 wherein said spring clip further comprises:

a body portion having first and second ends to which said first and second downwardly descending members are respectively joined; and an arm pivotally mounted to said body portion, said arm movable between a first position in which said first and second downwardly descending members extend below said bottom side surface of said heat spreader plate and a second position in which said first and second downwardly descending members are biased into engagement with said bottom side surface of said heat spreader plate.

5. The heat dissipation system of claim 4 wherein said arm further comprises:

an elongated shaft having first and second ends; and a cam formed on a first end of said elongated shaft, pivotally mounted to said body portion, and having a profile shaped such that movement of said arm presses said cam against said main body portion of said heat sink, thereby causing said arm to exert a force on said body portion of said spring clip to bias said first and second downwardly descending members into engagement with said bottom side surface of said heat spreader plate.

6. The heat dissipation system of claim 5 wherein said body portion is a leaf spring.

7. The heat dissipation system of claim 5 wherein said arm further comprises:

a tab formed on said second end of said elongated shaft; said tab being wider than said elongated shaft.

8. The heat dissipation system of claim 4 wherein said body portion further comprises:

a first spring member having first and second ends, said first downwardly descending member joined to said first end thereof; and a second spring member having first and second ends, said second downwardly descending member joined to said first end thereof;

said second end of said first spring member pivotally joined to said second end of said second spring member.

9. The heat dissipation system of claim 8 and further comprising:

a pivot pin, said pivot pin pivotally joining said first spring member, said second spring member and said arm.

10. The heat dissipation system of claim 9 wherein said arm further comprises:

an elongated shaft having first and second ends; and a cam formed on a first end of said elongated shaft, pivotally mounted to said first and second spring members by said pivot pin, and having a profile shaped such that movement of said arm presses said cam against said main body portion of said heat sink, thereby causing said arm to exert a force on said first and second spring members of said spring clip to bias said first and second downwardly descending members into engagement with said bottom side surface of said heat spreader plate.

11. The heat dissipation system of claim 10 wherein said pivot pin and said first and second spring members body portion form a jointed spring.

12. The heat dissipation system of claim 10 wherein said arm further comprises:

a tab formed on said second end of said elongated shaft; said tab being wider than said elongated shaft.

13. The heat dissipation system of claim 1 wherein said spring clip further comprises:

a rigid body portion having first and second ends to which said first and second downwardly descending members are respectively joined; and an arm pivotally mounted to said body portion, said arm movable between a first position in which said first and second downwardly descending members extend below said bottom side surface of said heat spreader plate and a second position in which said first and second downwardly descending members are biased into engagement with said bottom side surface of said heat spreader plate in response to spring bias exerted on said rigid body portion by said arm.

14. The heat dissipation system of claim 13 wherein said arm further comprises: an elongated shaft having first and second ends; and a deformable cam formed on a first end of said elongated shaft and pivotally mounted to said body portion and having a profile shaped such that movement of said arm deforms said deformable cam to produce a spring biasing force, exerted against said rigid body portion to bias said first and second downwardly descending members into engagement with said bottom side surface of said heat spreader plate.

15. The heat dissipation system of claim 4 wherein said arm further comprises:

a first lever portion; and a second lever portion joined to said first lever portion at a first angle.

16. The heat dissipation system of claim 15 wherein said first lever portion has a first length and said second lever portion has a second length shorter than said first length.

17. The heat dissipation system of claim 1 wherein said spring clip further comprises:

a body portion having first and second ends to which said first and second downwardly descending members are respectively joined; and a sliding member slidably mounted to said body portion, said sliding member moveable between a first position in which said first and second downwardly descending members extend below said bottom side surface of said heat spreader plate and a second position in which said first and second downwardly descending members are biased into engagement with said bottom side surface of said heat spreader plate.

18. The heat dissipation system of claim 17 wherein said sliding member further comprises a ramped projection formed in the general center thereof, said body portion of said spring clip further comprises a downwardly descending dog, said ramped projection engaging said downwardly descending dog when said sliding member is moved from said first position to said second position to bias said first and second downwardly descending members into engagement with said bottom side surface of said heat spreader plate.

19. The heat dissipation system of claim 18 wherein said ramped projection has a detent formed therein, said detent locking said sliding member in said second position.

20. The heat dissipation system of claim 19 wherein each of said first and second downwardly descending members has an aperture formed therein through which said sliding member extends.

21. The heat dissipation system of claim 1 wherein said spring clip further comprises:

a rigid body portion having first and second ends, said first downwardly descending member joined to said rigid body portion and said second downwardly descending member slidably mounted to said rigid body portion; and first and second leaf springs, said first and second leaf springs each extending angularly downward from a lower side surface of said rigid body portion said first and second leaf springs exerting a biasing force which opposes depression of said rigid body portion.

22. The heat dissipation system of claim 1 wherein said spring clip further comprises:

a body portion having first and second ends to which said first and second downwardly descending members are respectively joined;

said body portion being comprised of a central body portion and first and second joints, said first joint extending away from said central body portion in a first direction and including said first end joined to said first downwardly descending member and said second joint extending away from said central body portion in a second direction, opposite to said first direction, and including said second end joined to said second downwardly descending member;

each of said first and second joints having first and second apertures formed therein;

a machine screw extending through said first and second apertures of each of said first and second joints; and wherein rotation of said machine screw generates a spring force by pinching said first and second joints, said spring force biasing said first and second downwardly descending members into engagement with said bottom side surface of said heat spreader plate.

23. The heat dissipation system of claim 1 wherein said spring clip further comprises:

a rigid body portion having a slot formed therein and first and second ends to which said first and second downwardly descending members are respectively joined; and a sliding member slidably mounted to said rigid body portion, said sliding member having a first portion and a second portion bent at an acute angle relative to said first portion, said sliding member moveable between a first position in which said bent portion projects through said slot in said rigid body portion and said first and second downwardly descending members extend below said bottom side surface of said heat spreader plate and a second position in said bent portion is compressed by said rigid body portion to produce a spring force, exerted against said rigid body portion, for biasing said first and second downwardly descending members into secured engagement with said bottom side surface of said heat spreader plate.

24. The heat dissipation system of claim 1 wherein said spring clip further comprises:

a body portion having first and second ends to which said first and second downwardly descending members are respectively joined; and a spring lever arm attached, at one end, to said body portion;

wherein depression of a free end of said spring lever arm generates a spring force, siad spring force biasing said first and second downwardly descending members into engagement with bottom side surface of said heat spreader plate.

25. The heat dissipation system of claim 1 wherein said spring clip further comprises:

a body portion having first and second ends to which said first and second downwardly descending members are respectively joined;

said body portion being comprised of a central body portion and first and second angled body portions, said first angled body portion extending upwardly away from said central body portion in a first direction and including said first end joined to said first downwardly descending member and said second body portion extending upwardly away from said central body portion in a second direction, opposite to said first direction, and including said second end joined to said second downwardly descending member;

wherein depression of said first and second angled body portions generates a spring force, said spring force biasing said first and second downwardly descending members into engagement with said bottom side surface of said heat spreader plate.

26. The heat dissipation system of claim 25, further comprising:

a first and second tab formed in said first and second downwardly descending member, respectively, shaped to engage the bottom side surface of the heat spreader plate.

27. A spring clip for releasably securing a heat sink in thermal communication with a heat generating device package, comprising:

a body portion having first and second ends;

first and second downwardly descending members joined to said first and second ends of said body portion, respectively;

an arm pivotally mounted to said body portion, said arm movable between a first position in which said first and second downwardly descending members are biased into engagement and a second position in which said first and second downwardly descending members are not engaged.

28. The spring clip of claim 27 wherein said arm further comprises:

an elongated shaft having first and second ends; and a cam formed on a first end of said elongated shaft, pivotally mounted to said body portion, and having a profile shaped such that movement of said arm rotates said cam, thereby causing said arm to exert a force on said body portion of said spring clip to bias said first and second downwardly descending members into engagement.

29. The spring clip of claim 27 wherein said arm further comprises:

an elongated shaft having first and second ends; and a deformable cam formed on a first end of said elongated shaft and pivotally mounted to said body portion and having a profile shaped such that movement of said arm deforms said deformable cam to produce a spring biasing force exerted against said body portion to bias said first and second downwardly descending members into engagement.

30. The spring clip of claim 27 wherein said arm further comprises:

a first lever portion; and a second lever portion joined to said first lever portion at a first angle.

31. A spring clip for releasably securing a heat sink in thermal communication with a heat generating device package, comprising:

a body portion having first and second ends;

first and second downwardly descending members joined to said first and second ends of said body portion, respectively;

a sliding member slidably mounted to said body portion, said sliding member moveable between a first position in which said first and second downwardly descending members are biased into engagement and a second position in which said first and second downwardly descending members are not engaged.

* * * * *